(12) United States Patent
Boyle (10) Patent No.: US 8,330,667 B2
(45) Date of Patent: Dec. 11, 2012

(54) PORTABLE WIRELESS DEVICE

(75) Inventor: Kevin R. Boyle, West Sussex (GB)

(73) Assignee: Epcos AG, Munich (DE)

( * ) Notice: Subject to any disclaimer, the term of this patent is extended or adjusted under 35 U.S.C. 154(b) by 337 days.

(21) Appl. No.: 12/812,363

(22) PCT Filed: Jan. 13, 2009

(86) PCT No.: PCT/EP2009/000147
§ 371 (c)(1),
(2), (4) Date: Jul. 9, 2010

(87) PCT Pub. No.: WO2009/090035
PCT Pub. Date: Jul. 23, 2009

(65) Prior Publication Data
US 2010/0289711 A1    Nov. 18, 2010

(30) Foreign Application Priority Data
Jan. 14, 2008   (EP) .................................... 08100446

(51) Int. Cl.
*H01Q 9/04*    (2006.01)
(52) U.S. Cl. ........................................ 343/750; 343/860
(58) Field of Classification Search .......... 343/749–751, 343/850, 860, 876, 893
See application file for complete search history.

(56) References Cited

U.S. PATENT DOCUMENTS

| 4,493,112 A | 1/1985 | Bruene |
| 6,784,744 B2 * | 8/2004 | Tichauer ........................ 330/285 |
| 7,746,290 B2 * | 6/2010 | Skarp et al. .................... 343/860 |
| 2007/0004344 A1 | 1/2007 | DeGroot et al. |

FOREIGN PATENT DOCUMENTS

| DE | 10340808 A1 | 3/2005 |
| EP | 1220456 A2 | 7/2002 |
| EP | 1564896 A1 | 8/2005 |

(Continued)

OTHER PUBLICATIONS

Written Opinion corresponding to International Patent Application No. PCT/EP2009/000147, European Patent Office, dated Jun. 5, 2009, 4 pages.

(Continued)

*Primary Examiner* — Don Le
(74) *Attorney, Agent, or Firm* — Nixon Peabody LLP (57) ABSTRACT

A method of offsetting a mismatch due to user interaction when handling a portable wireless terminal in which antenna matching is changed from inductive matching to capacitive matching in response to a reactance change exceeding a threshold level and vice versa when an opposite change is detected. An antenna interface module (44) is coupled between a RF output or input stage (25 or 33) and an antenna (48 or 50). The antenna interface module includes first and second switches (SW1/1, SW1/2 or SW2/1, SW2/2), a first matching circuit including an inductive reactance (68 or 96) coupled between the power amplifier and the first switch and a second matching circuit including a capacitive reactance (68 or 92) is coupled between the RF output or input stage and the second switch (SW1/1 or SW2/1). A reactance threshold detector (54 or 56) determines if the reactance change traverses a predetermined threshold value and causes the first and second switches to be actuated so that the matching changes from inductive to capacitive or vice versa.

10 Claims, 10 Drawing Sheets

FOREIGN PATENT DOCUMENTS

| | | |
|---|---|---|
| GB | 804103 | 11/1958 |
| GB | 1362154 | 7/1974 |
| WO | 2004/010595 A1 | 1/2004 |
| WO | 2006/038167 A1 | 4/2006 |
| WO | 2006/054246 A1 | 5/2006 |

OTHER PUBLICATIONS

International Search Report corresponding to International Patent Application No. PCT/EP2009/000147, European Patent Office, dated Jun. 5, 2009, 3 pages.

* cited by examiner

PORTABLE WIRELESS DEVICE

CROSS-REFERENCE TO RELATED APPLICATION

This application claims the benefit of International Application No. PCT/EP2009/000147, filed Jan. 13, 2009, entitled "Improvements in or Relating to Portable Wireless Devices" which claims the benefit of European Patent Application No. 08100446.7, filed on Jan. 14, 2008, entitled "Improvements in or Relating to Portable Wireless Devices" both of which are incorporated herein by reference in their entireties.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The present invention relates to improvements in or relating to portable wireless devices. The present invention has particular, but not exclusive, application to matching of antenna structures used in mobile phones and other portable wireless devices.

BACKGROUND

A problem with operating hand portable wireless devices having small planar antennas, such as planar inverted-F antennas (PIFAs), is that when a user holds a device, the antenna's impedance changes predominantly reactively. As a result the matching of the antenna to radio frequency circuitry is affected adversely by these reactive changes.

EP 1 564 896 A1 discloses altering the value of an impedance connected between a power amplifier and an antenna to achieve power control in the output stage of a power amplifier. In operation the actual load impedance at the antenna is measured and the value of the impedance is adjusted so that only a purely resistive load is experienced by the power amplifier.

WO 2006/054246 discloses a controlled matching stage connected between the output of a power amplifier and an antenna stage. The controlled matching stage comprises a phase detector for detecting the phase difference between a first signal derived from the power amplifier and a second signal derived from an input to a switching stage coupled to the antenna stage. The difference in phase between the first and second signals is used to adjust the impedance of the switching stage. Typically the switching stage comprises a series LC circuit comprising a fixed inductance and an adjustable capacitance.

GB 0 804,103A discloses an automatic tuning system using servo motors driving respectively an adjustable antenna input coupling and a sliding short circuit. The resistance and reactance of a transmission line connecting a transmitter to an antenna are sensed and the results are used in driving servo amplifiers controlling the servo motors. Measures are disclosed enabling the servo motors initially to be driven rapidly and then to move more slowly.

GB1 362 154 A discloses an automatic tuner for transforming the impedance of an antenna to a load resistance required for the power amplifier output stage of a transmitter. The automatic tuner uses a method of control of the tuning circuit element requiring phase and impedance inputs indicative of the reactive condition of the selected antenna. The phase input is used to control the switching of capacitors in an antenna impedance matching network and the impedance input is used to control the switching of impedances in the antenna impedance matching network.

WO 2006/038167 A1 discloses coupling a RF power amplifier to an antenna by way of a circuit for detecting the impedance of the antenna. The circuit detects a signal travelling from the RF power amplifier to the antenna and measures the peak current of the signal. More particularly the circuit comprises first means for sensing the peak value of the output voltage of the RF power amplifier, second means for sensing the peak of the output current of the RF power amplifier, and third means for deriving the phase between the output voltage and output current.

WO 2004/010595 A1 discloses a device for dynamic impedance matching between a power amplifier and an antenna. The device includes a circulator which routes a signal received from the power amplifier at a first port via a second port to the antenna. Additionally the circulator diverts a signal reflected at the antenna and received at the second port through a third port. A matching network is provided. In operation a directional coupler diverts a proportion of the signal travelling from the power amplifier to the antenna, from which the magnitude and phase of the signal may be derived, to a signal detector. The circulator routes the entire signal reflected at the antenna into the signal detector. The signal detector passes the magnitude and phase of both the signal travelling to the antenna and the signal reflected at the antenna to a controller, which evaluates the information received from the signal detector in order to determine the present impedance value of the antenna and to correct the controllable matching network containing active and passive components in accordance with the determined impedance value of the antenna.

BRIEF SUMMARY

An object of the present invention is to be able to provide an acceptable match of an RF stage to an antenna structure both in free space and when user interaction occurs.

According to an aspect of the present invention there is provided a portable wireless terminal comprising an antenna interface module having a first port for connection to a RF output or input stage and a second port, a threshold detector including a reactance threshold detector coupled between the second port and an antenna terminal for connection to an antenna, the antenna interface module including first and second switches, a first matching circuit including an inductive reactance coupled between the first port and a first pole of the first switch, a second matching circuit including a capacitive reactance coupled between the first port and a first pole of the second switch, second poles of the first and second switches being coupled to the second port, the threshold detector providing an output for changing the state of the first switch from a first condition to a second condition and the state of the second switch from a second condition to a first condition, or vice versa, in response to the reactance threshold detector traversing a predetermined threshold value.

According to a second aspect of the present invention there is provided a method of operating a portable wireless terminal comprising an antenna interface module having a first port for connection to a RF output or input stage and a second port, a threshold detector including a reactance threshold detector coupled between the second port and an antenna terminal for connection to an antenna, the antenna interface module including first and second switches, a first matching circuit including an inductive reactance coupled between the first port and a first pole of the first switch, a second matching circuit including a capacitive reactance coupled between the first port and a first pole of the second switch, and second poles of the first and second switches being coupled to the second port, the method comprising monitoring the reactance of the signal at the second port and, in response to the reactance threshold detector traversing a predetermined threshold value, changing the state of the first switch from a first condition to a second condition and the state of the second switch from a second condition to a first condition, or vice versa.

Aspects of the present invention are based on the realisation that in free space a transmitter RF stage can be matched to an antenna using a series inductance but user interaction, that is, the wireless terminal being held by a user, causes an inductive shift that in many cases is counterproductive. In such cases matching can be achieved by capacitive matching. As the user interaction varies from person to person it is desirable that the change from inductive matching to capacitive matching and vice versa is effected dynamically. In implementing a portable wireless terminal made in accordance with aspects of the present invention the reactance of an antenna is monitored and if a reactance change is detected that traverses a threshold value in either direction, the reactance threshold detector causes the matching to switch from inductive to capacitive or vice versa.

BRIEF DESCRIPTION OF THE DRAWINGS

The present invention will now be described, by way of example, with reference to the accompanying drawings, wherein.

In the drawings the same reference numerals have been used to indicate corresponding features.

DETAILED DESCRIPTION

For convenience of description aspects of the present invention will be described with reference to a portable wireless terminal capable of operating in accordance with various radio communication standards operable in a relatively low frequency band between 824 and 960 MHz and in a relatively high frequency band between 1710 and 2170 MHz.

Figure 1:
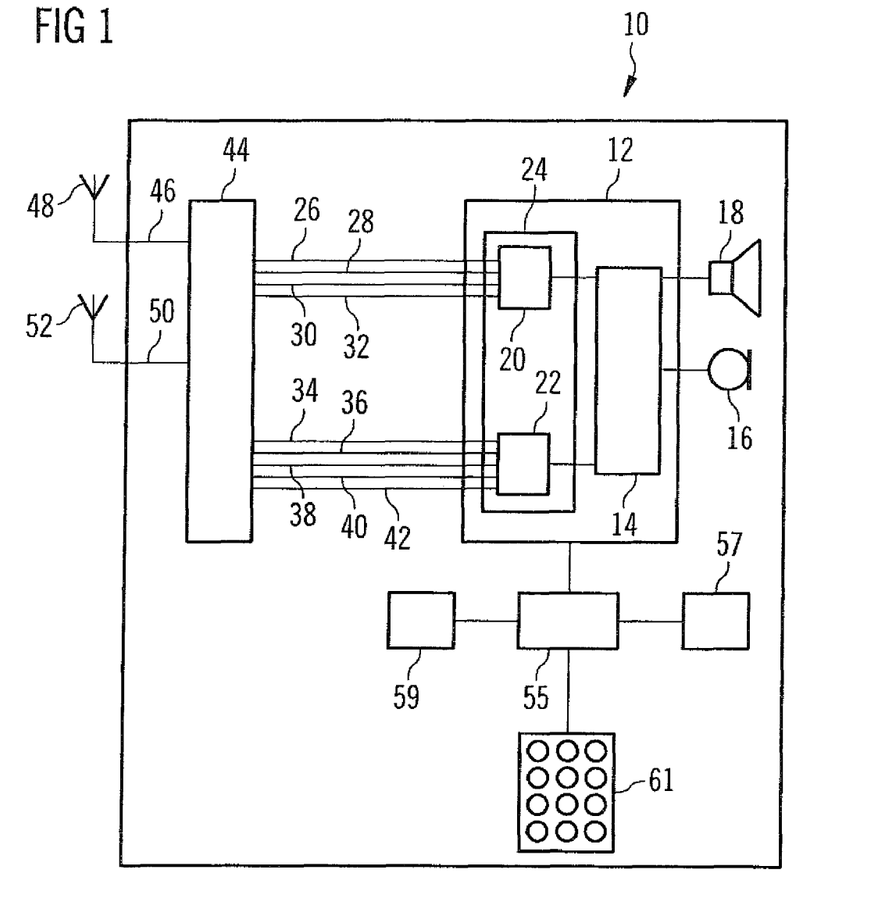
FIG. 1 is a block schematic diagram of a portable wireless terminal made in accordance with an aspect of the present invention.

Referring to FIG. 1 the portable wireless terminal 10 comprises a radio transmitting and receiving stage 12 formed by an audio frequency (AF) stage 14 and a radio frequency (RF) stage 24. The AF stage 14 has an input coupled to a microphone 16 and an output coupled to a loudspeaker 18. The RF stage 24 has terminals coupled to respective low and high frequency RF transceiver stages 20, 22 forming the RF stage 24. The transceiver stages 20, 22 have input/output ports coupled respectively to ports 26 to 32 and 34 to 42 of an antenna interface module (AIM) 44 to be described in greater detail with reference to FIG. 2. The AIM 44 has a first low frequency band antenna coupling 46 connected to a low frequency band antenna 48 and a second high frequency band antenna coupling 50 connected to a high frequency band antenna 52. The antennas 48, 52 comprise any suitable antennas such as Planar Inverted-F Antennas (PIFAs).

The portable wireless terminal 10 further includes a microcontroller 55 for controlling the operation of the terminal 10 using control software stored in a Read Only Memory (ROM) 57. The microcontroller 55 is coupled to the radio transmitting and receiving stage 12 to configure that stage to operate in accordance with a desired radio standard. A Random Access Memory (RAM) 59 is coupled to the microcontroller 55 and serves to store data such as data messages. A man/machine interface represented by a keypad 61 is also coupled to the microcontroller 55. The basic operation of the portable wireless terminal 10 will be understood by persons skilled in the art without requiring additional explanation.

Figure 2:
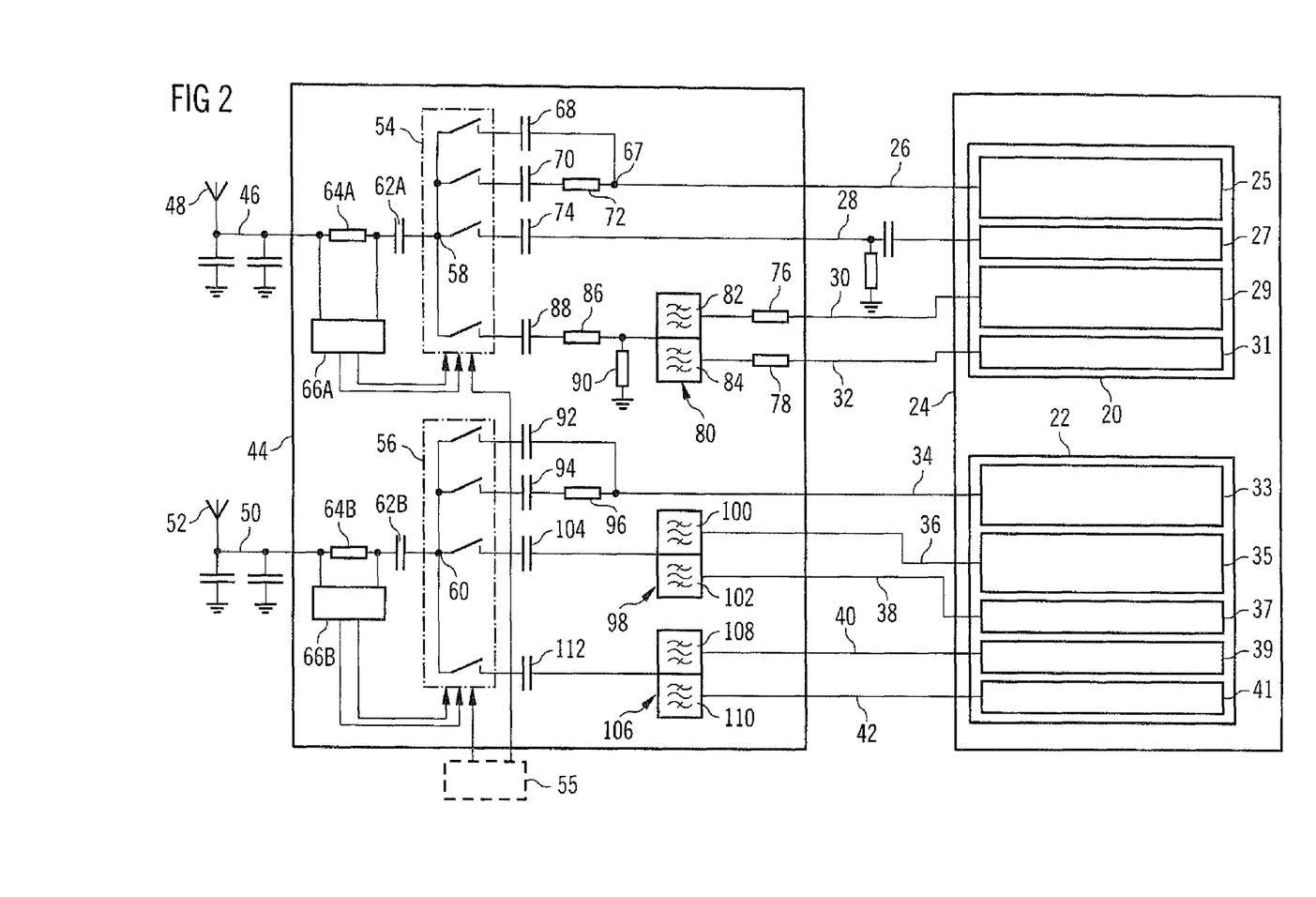
FIG. 2 is a partially block schematic and partially schematic circuit diagram of an RF stage and an antenna interface module as used in the portable wireless terminal shown in FIG. 1.

Referring to FIG. 2, the low and high frequency RF stages 20, 22, respectively comprise a plurality of output/input stages 25 to 31 and 33 to 41. The stages 25 to 31 respectively represent GSM850 TX 824-849/GSM900 TX 880-915; GSM900 RX 925-960; GSM850 RX 869-894/UTRA V RX 869-894 and UTRA V TX 824-849, and the stages 33 to 41 respectively represent GSM1800 TX 1710-1785/GSM1900 TX 1850-1910; GSM1900 RX 1930 1990/UTRA II RX 1930-1990; UTRA II TX 1850-1910; UTRA I RX 2110-2170 AND UTRA I TX 1920-1980. TX refers to the transmitter frequency band and RX refers to the receiver frequency band. GSM refers to Global System for Mobile Communications, and UTRA is the abbreviation used for UMTS (Universal Mobile Telecommunications System) Terrestrial Radio Access and has the following bands:

| Band | TX (MHz) | RX (MHz) |
|------|----------|----------|
| I    | 1920-1980 | 2110-2170 |
| II   | 1850-1910 | 1930-1990 |
| III  | 1710-1785 | 1805-1880 |
| IV   | 1710-1755 | 2110-2155 |
| V    | 824-849   | 869-894   |
| VI   | 830-840   | 875-885   |
| VII  | 2500-2570 | 2620-2690 |
| VIII | 880-915   | 925-960   |
| IX   | 1749.9-1784.9 | 1844.9-1879.9 |

The transmitter stages 25, 31, 33, 37 and 41 can typically comprise power amplifier stages and the receiving stages 27, 29, 35 and 39 can typically comprise a low noise amplifier and RF filtering stages. The ports 26 to 32 and 34 to 42 of the AIM 44 are coupled respectively to the stages 25 to 31 and 33 to 41.

The AIM 44 comprises first and second banks 54, 56 of switches SW1/1 to SW1/4 and SW2/1 to SW2/4. The switches may comprise any suitable switching means such as pHEMTs (pseudomorphic High Electron Mobility Transistors), MEMS (Micro Electro-Mechanical Systems) devices or PIN diodes. Each of the switches SW1/1 to SW1/4 and SW2/1 to SW2/4 has first and second poles. The second poles of the bank 54 are coupled to a common junction or port 58, and the second poles of the bank 56 are coupled to a common junction or port 60. Each of the common junctions 58, 60 is coupled respectively to the low frequency band antenna 48 and to the high frequency band antenna 50 by way of a respective series connection of a dc blocking capacitor 62A, 62B and an inductive reactance 64A, 64B of a threshold detector 66A, 66B. In the embodiment shown in FIG. 2, the first and second banks 54, 56 are controlled by the microcontroller 55 (FIG. 1) to select a particular one of the ports 26 to 42 to be connected to a respective antenna 48 or 52. Additionally for the ports 26, 34 having inductive/capacitive antenna matching, the switches SW1/1 and SW1/2 and the switches SW2/1 and SW2/2 are additionally controlled by dc control signals produced by the threshold detector 66A, 66B.

The port 26 is coupled to a junction 67. The first pole of the switch SW1/1 is coupled by way of an antenna matching capacitance 68 to the junction 67. An antenna matching inductance 72 on the one hand is coupled to the junction 67 and on the other hand is coupled by way of a dc blocking capacitor 70 to the first pole of the switch SW1/2. The port 28 is coupled by way of an antenna matching capacitance 74 to the first pole of the switch SW1/3. The ports 30 and 32 are coupled by respective inductances 76, 78 to respective bandpass filters 82, 84 of a duplexer filter 80. An output of the duplexer filter 80 is coupled by way of an antenna matching arrangement to the first pole of the switch SW 1/4. The antenna matching arrangement comprises an inductance 86 and a capacitance 88 together with a shunt inductance 90 connected to ground.

The port 34 is coupled to a junction 91. The first pole of the switch SW2/1 is coupled by way of an antenna matching capacitance 92 to the junction 91. An antenna matching inductance 96 on the one hand is coupled to the junction 91 and on the other hand is coupled by way of a dc blocking capacitor 94 to the first pole of the switch SW2/2. The ports 36 and 38 are coupled to respective bandpass filters 100, 102 of a duplexer filter 98. An output of the duplexer filter 98 is coupled by way of an antenna matching capacitance 104 to the first pole of the switch SW2/3. The ports 40 and 42 are coupled to respective bandpass filters 108, 110 of a duplexer filter 106. An output of the duplexer filter 106 is coupled by way of an antenna matching capacitance 112 to the first pole of the switch SW2/4.

With respect to an understanding of the present invention it will be noted from the preceding description that GSM850 TX 824-849 and GSM900 TX 880-915 share a power amplifier port in the stage 25. Hence, the operation of the switches SW1/1 and SW 1/2 can be chosen dynamically, in response to a dc control voltage of the reactance threshold detector 66A. The reactance threshold detector 66A is responsive to the change of reactance of the antenna when the wireless terminal is held by a user as opposed to being in free space, and vice versa. The same is true at the GSM1800 TX 1710-1785 and GSM1900 TX 1850-1910 power amplifier port in the stage 33 (where switches SW2/1 and SW 2/2 can be dynamically set). The teachings of the present invention are not limited to the GSM transmit channels but can be applied to matching any or all of the other stages 27 to 31 and 35 to 41 to their respective antennas.

Figure 3:
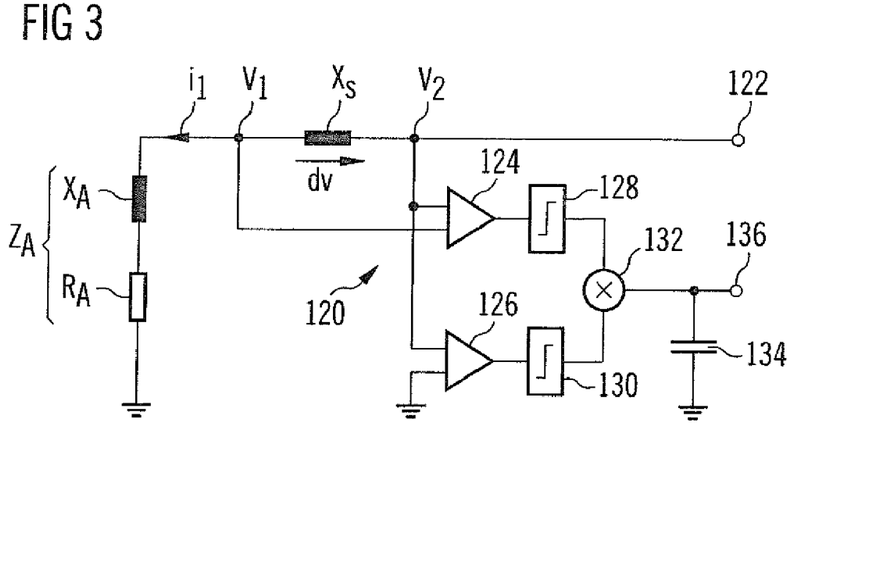
FIG. 3 is a schematic circuit diagram of a reactance threshold detector.

FIG. 3 illustrates a reactance threshold detector 120 that can be used for determining whether the antenna reactance has exceeded a threshold. This can be achieved using a reactance threshold detector with an inductor or capacitor of a certain value.

The reactance threshold detector 120 comprises a reactance $X_S$ which can be an inductor or capacitor. A signal from a RF front end is applied to a terminal 122 and a current $i_1$ flows to the antenna impedance $Z_A$ which is represented by a series arranged antenna resistance $R_A$ and reactance $X_A$. The voltage $v_1$ at the antenna side of the reactance $X_S$ is supplied to one input of a first high impedance buffer amplifier 124. A voltage $v_2$ at the other side of the reactance $X_S$ is applied to a second input of the amplifier 124 and to one input of a second high impedance buffer amplifier 126, a second input of which is connected to ground. The outputs of the amplifiers 124, 126 are limited in respective limiters 128, 130, the outputs from which are multiplied in a multiplier 132. A dc control voltage is available on a terminal 136 coupled to the output of the multiplier 132. A filter consisting of a large value shunt capacitor 134 is also coupled to the output of the multiplier 132.

The operation of the phase detector will now be described.

The reactance, $X_S$ is used as a sensing element, about which the two voltages, $v_1$ and $v_2$ are monitored. The first amplifier 124 processes the difference voltage $dv = v_2 - v_1$, while the second amplifier 126 operates on $v_2$ as drawn. This amplifier may also be configured to amplify $v_i$. The amplifiers also serve as high impedance buffers.

The voltages $v_1$ and $v_2$ are functions of the antenna impedance, $Z_A = R_A + jX_A$ and are given by:

$$v_1 = i_1 |Z_A| \cos(\omega t \pm \phi_1) \quad\quad 1)$$

$$v_2 = i_1 |Z_A + X_S| \cos(\omega t + \phi_2) \quad\quad 2)$$

where the phases, $\phi_1$ and $\phi_2$ are related to the impedances by $$\varphi_1 = \tan^{-1}\left(\frac{X_A}{R_A}\right) \quad\quad 3)$$

$$\varphi_2 = \tan^{-1}\left(\frac{X_A + X_s}{R_A}\right) \quad\quad 4)$$

$\phi_1$ is the phase of the antenna impedance. $\phi_2$ is used for reactance measurement.

The difference voltage, dv is given by $$dV = i_1 |x_S| \cos(\cos(\omega t \pm 90)) \quad 5)$$

where the sign within the parentheses is positive for an inductor and negative for a capacitor.

Amplifying and limiting these voltages using the amplifiers 124, 126 and limiters 128, 130 removes amplitude information. Multiplying the amplified and limited versions of $v_1$ and dv yields:

$$A \cos(\omega t + \phi_1)\cos(\omega t \pm 90) = B \cos(2\omega t + \phi_1 \pm 90) + \cos(\phi_1 \mp 90) \quad 6)$$

where A and B are constants of proportionality.

Filtering this with a large valued shunt capacitor 134, as shown in FIG. 3, leaves only the DC part, which can be written as follows:

$$V_{DC} = \mp B \sin(\phi_1) \quad 7)$$

Here the negative and positive signs apply to capacitive and inductive sensing respectively.

Similarly, $v_2$ and dv can be processed, which yields:

$$V_{DC} = \mp B \sin(\phi_2) \quad 8)$$

The previous sub-section shows that a given $V_{DC}$ corresponds to a particular phase. From equations (3) and (4), $V_{DC}$ also corresponds to a range of antenna resistance and reactance values that may be plotted as contours on a Smith Chart. The simplest way to do this is to first express resistances and reactances in terms of real and imaginary components of reflection coefficient: the x and y axes of the chart respectively.

As derived in Appendix A included at the end of the description, the normalised antenna resistance, $r_A$ and reactance, $x_A$ are related to the real and imaginary components of reflection coefficient by $$r_A = \frac{1 - \rho_{Ar}^2 - \rho_{Ai}^2}{(1 - \rho_{Ar})^2 + \rho_{Ai}^2} \quad 9)$$

$$x_A = \frac{2\rho_{Ai}}{(1 - \rho_{Ar})^2 + \rho_{Ai}^2} \quad 10)$$

where
$p_{Ar}$ real part of antenna reflection coefficient
$p_{Ai}$ imaginary part of antenna reflection coefficient If $v_1$ and dv are processed by the phase detector, from equation (3) the phase—and, therefore $V_{DC}$—is constant when $x_A/r_A$ is constant. Hence, $$\frac{x_A}{r_A} = \frac{2\rho_{Ai}}{1 - \rho_{Ar}^2 - \rho_{Ai}^2} = \frac{1}{K_1} \quad 11)$$

where, from equation (3), $K_1$ is given by $$K_1 = \cot(\phi_1) \quad 12)$$

Simplifying equation (11) gives $$\rho_{Ar}^2 + \rho_{Ai}^2 + 2K_1 \rho_{Ai} - 1 = \quad 13)$$

This can be rearranged to give $$\rho_{Ar}^2 + (\rho_{Ai} + K_1)^2 = (\sqrt{1 + K_1^2})^2 \quad 14)$$

This is the equation of a circle in the ($\rho_{Ar}, \rho_{Ai}$) plane, centered at (0, $-K_1$) and with a radius equal to $\sqrt{1+K_1^2}$. Because $K_1 = \tan^{-1}(\phi_1)$, this can also be written $$\rho_{Ar}^2 + [\rho_{Ai} + \cot(\phi_1)]^2 = \left(\frac{1}{\cos(\phi_1)}\right)^2 \quad 15)$$

Figure 4:
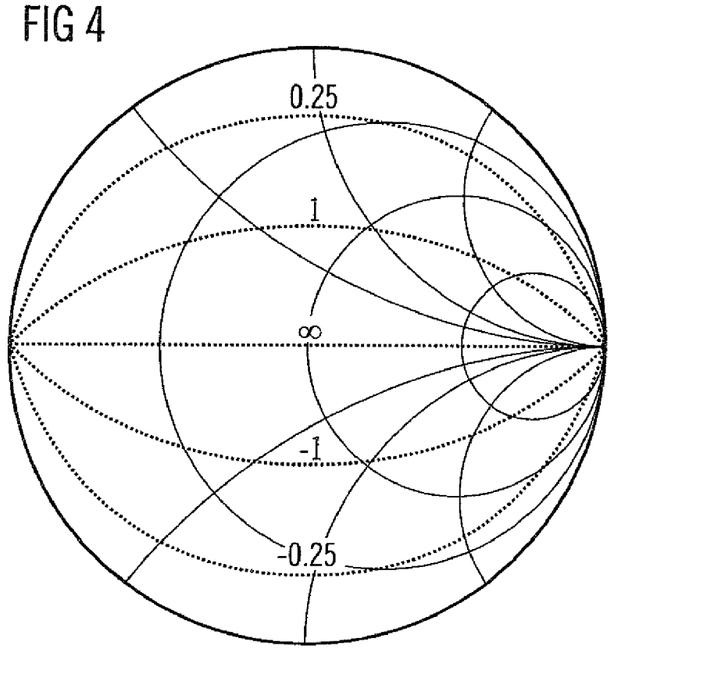
FIG. 4 is a Smith chart showing contours of constant $K_1$ with antenna impedance, $Z_A$.

Equation (14) can be used to draw contours of constant $K_i$ on a Smith Chart that is used to represent all possible antenna impedances. From equations (7) and (12), when $K_1 = \infty$, $V_{DC}$ is zero and the contour is a line of zero reactance (a horizontal line through the centre of the chart). All other lines begin and end at the points representing short and open circuits, as shown in FIG. 4.

The contours of the previous sub-section show when the phase of the antenna impedance is constant. However contours of constant phase are sub-optimal in so far as the present invention is concerned. This is because the phase of an antenna runs approximately parallel to the contours of constant phase and only small voltage changes can be detected. The present invention is concerned with using contours of constant reactance and changes in impedance cross the contours of constant reactance substantially orthogonally.

Means by which a constant reactance can be measured will now be derived.

For constant reactance, $v_2$ and dv are processed by the reactance threshold detector. From equations (4) and (8) $V_{DC}$ is constant when $(x_A + x_S)/r_A$ is constant. Hence, $$\frac{x_A + x_S}{r_A} = \frac{2\rho_{Ai}}{1 - \rho_{Ar}^2 - \rho_{Ai}^2} + x_S \frac{(1 - \rho_{Ar})^2 + \rho_{Ai}^2}{1 - \rho_{Ar}^2 - \rho_{Ai}^2} = \frac{1}{K_2} \quad 16)$$

where, from equation (4), $K_2$ is given by $$K_2 = \cot(\phi_2) \quad 17)$$

Simplifying equation (16) gives $$\rho_{Ar}^2(1+K_2 x_S) - 2K_2 x_S \rho_{Ar} + \rho_{Ai}^2(1+K_2 x_S) + 2K_2 \rho_{Ai} + K_2 x_S - 1 = 0 \quad 18)$$

Hence, $$\rho_{Ar}^2 - \frac{2K_2 x_S \rho_{Ar}}{1 + K_2 x_S} + \rho_{Ai}^2 + \frac{2K_2 \rho_{Ai}}{1 + K_2 x_S} + \frac{K_2 x_S - 1}{1 + K_2 x_S} = 0 \quad 19)$$

Substituting $$\left(\rho_{Ar} - \frac{K_2 x_S}{(1+K_2 x_S)}\right)^2 = \rho_{Ar}^2 - \frac{2K_2 x_S \rho_{Ar}}{(1+K_2 x_2)} + \left(\frac{K_2 x_S}{1+K_2 x_S}\right)^2 \quad 20)$$

and $$\left(\rho_{Ai} + \frac{K_2}{(1+K_2 x_A)}\right)^2 = \rho_{Ai}^2 + \frac{2K_2 \rho_{Ai}}{(1+K_2 x_S)} + \left(\frac{K_2}{1+K_2 x_S}\right)^2 \quad 21)$$

in equation (19) gives $$\left(\rho_{Ar} - \frac{K_2 x_S}{(1+K_2 x_S)}\right)^2 + \left(\rho_{Ai} + \frac{K_2}{(1+K_2 x_S)}\right)^2 = \left(\frac{K_2 x_S}{1+K_2 x_S}\right)^2 + \left(\frac{K_2}{1+K_2 x_S}\right)^2 + \frac{1 - K_2 x_S}{1+K_2 x_S} \quad 22)$$

The terms on the right of this equation can be written $$\frac{(K_2 x_S)^2 + K_2^2 + (1 - K_2 x_S)(1 + K_2 x_S)}{(1 + K_2 x_S)^2} = \left(\frac{\sqrt{1 + K_2}}{1 + K_2 x_S}\right)^2 \quad 23)$$

Hence, $$\left(\rho_{Ar} - \frac{K_2 x_S}{(1 + K_2 x_S)}\right)^2 + \left(\rho_{Ai} + \frac{K_2}{(1 + K_2 x_S)}\right)^2 = \left(\frac{\sqrt{1 + K_2}}{1 + K_2 x_S}\right)^2 \quad 24)$$

Once again, this is the equation of a circle in the ($\rho_{Ar}, \rho_{Ai}$) plane. The circle is centred at ($K_2 x_S$, $1+K_2 x_S$), $-K_2/(1+K_2 x_S)$) and the radius is given by $\sqrt{1+K_2}/1+K_2 x_S$. Again this can be used to draw contours of constant $K_2$.

From equations (8) and (17) $V_{DC}$ is zero for $K_2 = \infty$, when the centre coordinates and radius are as follows;

$$\lim_{K_2 \to \infty} \left\{\frac{K_2 x_S}{(1 + K_2 x_S)}\right\} = 1 \quad 25)$$

$$\lim_{K_2 \to \infty} \left\{\frac{K_2}{(1 + K_2 x_S)}\right\} = \frac{1}{x_S} \quad 26)$$

$$\lim_{K_2 \to \infty} \left\{\frac{\sqrt{1 + K_2}}{1 + K_2 x_S}\right\} = \frac{1}{x_S} \quad 27)$$

Hence, when Voc is zero, eauation (24) simplifies to $$(\rho_{Ar} - 1)^2 + \left(\rho_{Ai} + \frac{1}{x_S}\right)^2 = \left(\frac{1}{x_S}\right)^2 \quad 28)$$

This is directly equivalent to a line of constant normalised reactance, $-x_S$ on a Smith Chart (see Appendix A). As such, this can be used to set a reactance detection threshold: a reactance below $-x_S$ will give a negative $V_{DC}$, whereas a reactance above $-x_S$ will give a positive $V_{DC}$.

Figure 5:
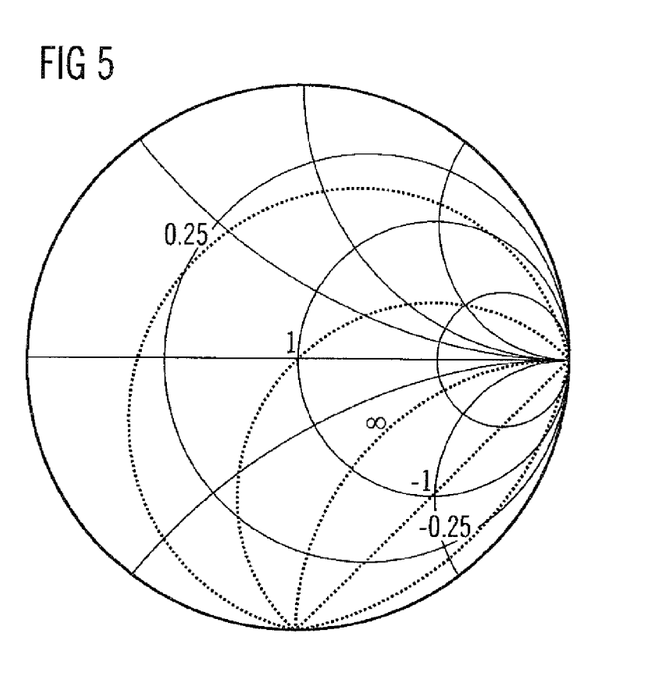
FIG. 5 is a Smith chart showing contours of constant $K_2$ with antenna impedance, $Z_A$, for $x_S=1$.

Contours of constant $K_2$ are plotted in FIG. 5 for $x_S=1$. Clearly the contour for $K_2=\infty$ coincides with the $x_A=-1$ constant reactance circle.

Figure 6:
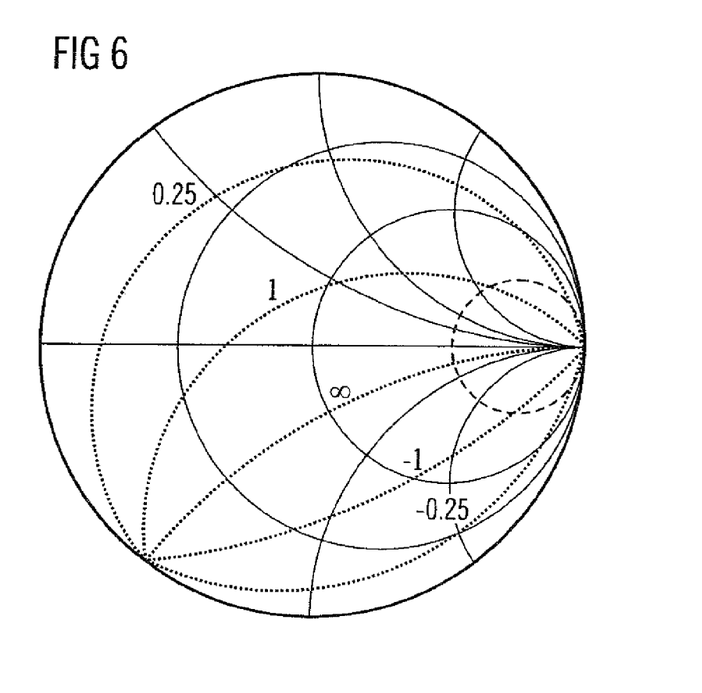
FIG. 6 is a Smith chart showing contours of constant $K_2$ with antenna impedance, $Z_A$, for $x_S=0.5$.
Figure 7A:
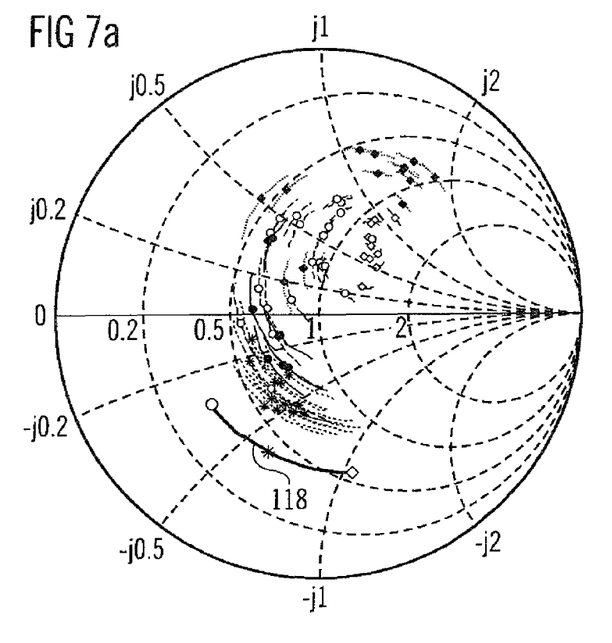
FIG. 7 shows in diagram a) a Smith chart and in diagram b) a graph of Voltage Standing Wave Ratio as a function of frequency in MHz in the GSM850 TX band (824-849 MHz band), for Antenna Interface Module (AIM) impedances in free space and user interaction without adaptive switching.
Figure 7B:
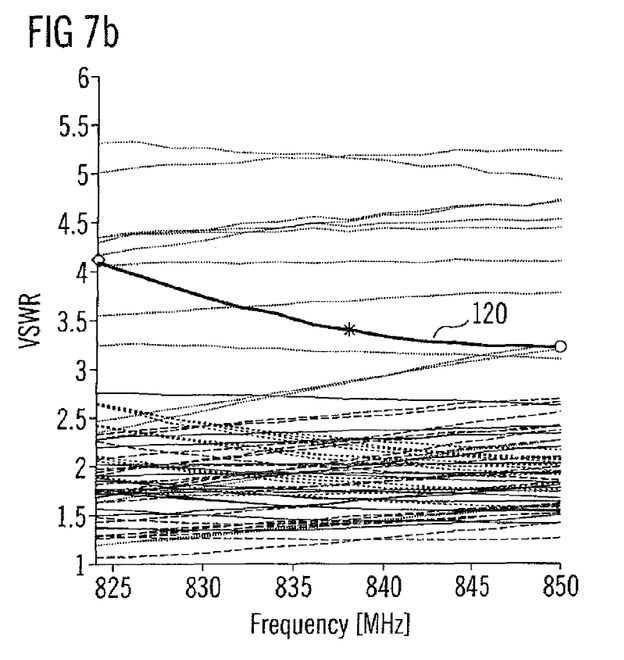
Figure 8A:
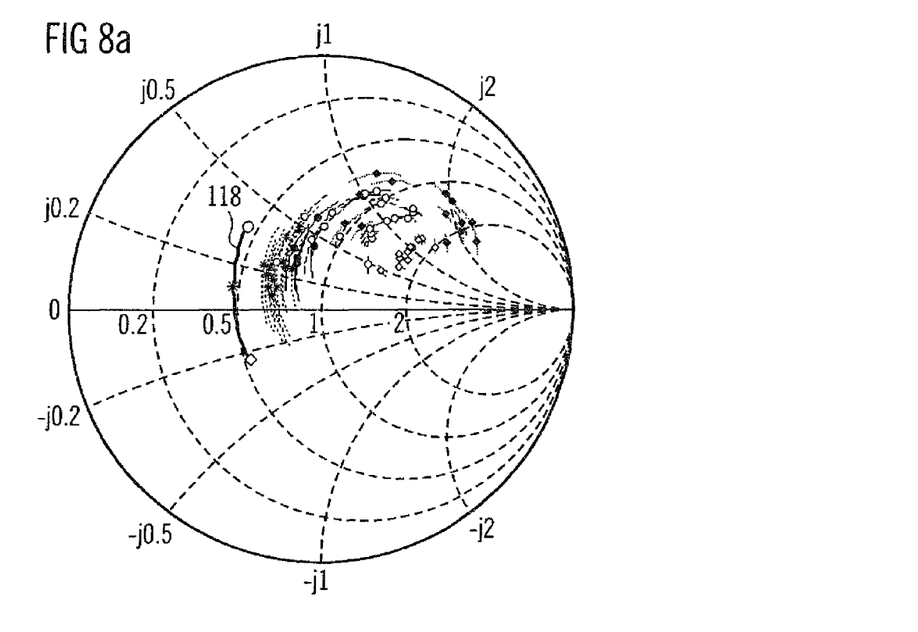
FIG. 8 shows in diagram a) a Smith chart and in diagram b) a graph of Voltage Standing Wave Ratio as a function of frequency in MHz in the GSM850 TX band, for Antenna Interface Module (AIM) impedances in free space and with user interaction.
Figure 8B:
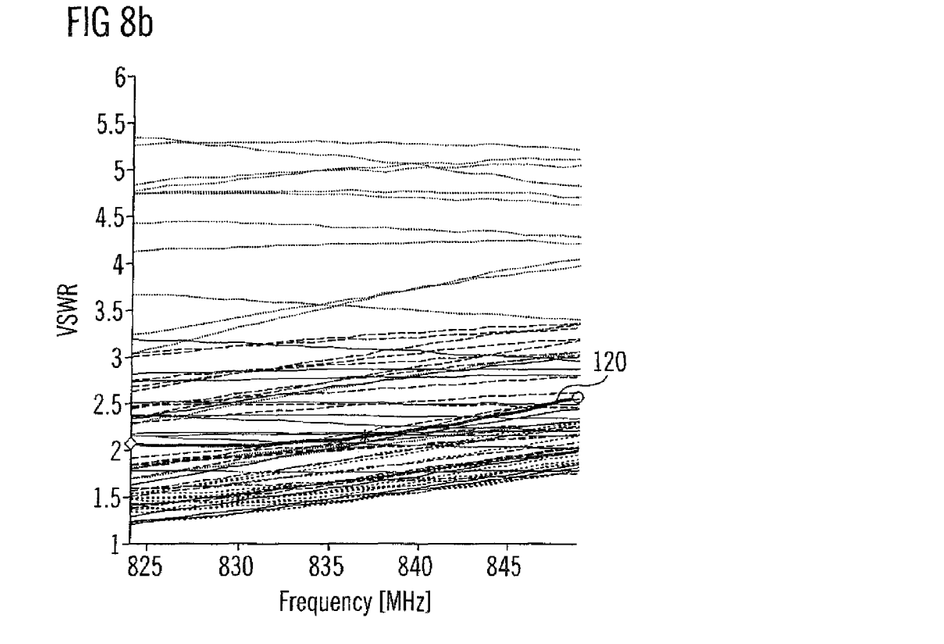
Figure 9A:
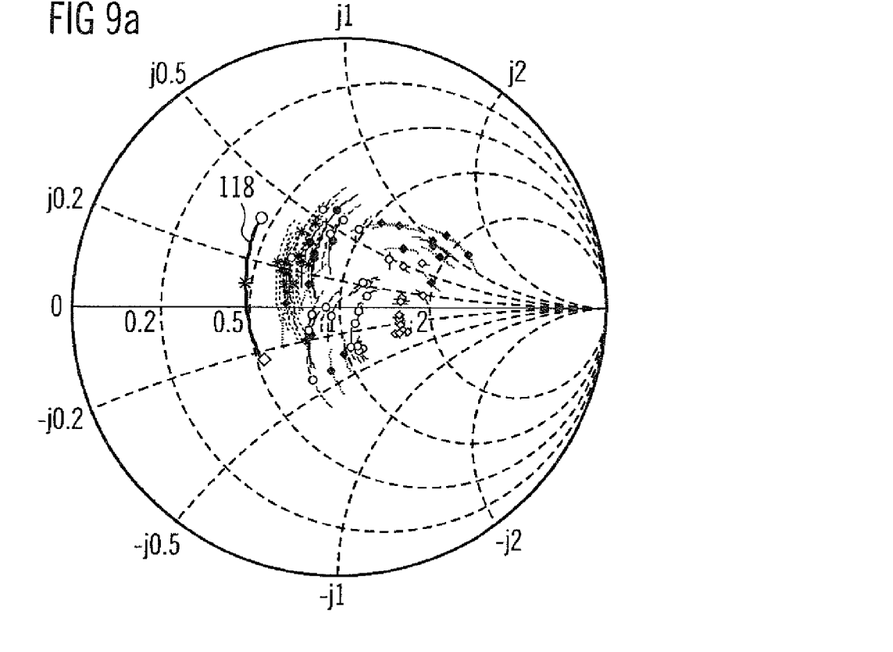
FIG. 9 shows in diagram a) a Smith chart and in diagram b) a graph of Voltage Standing Wave Ratio as a function of frequency in MHz in the GSM850 TX band, for AIM impedances in free space and with user interaction with adaptive switching.
Figure 9B:
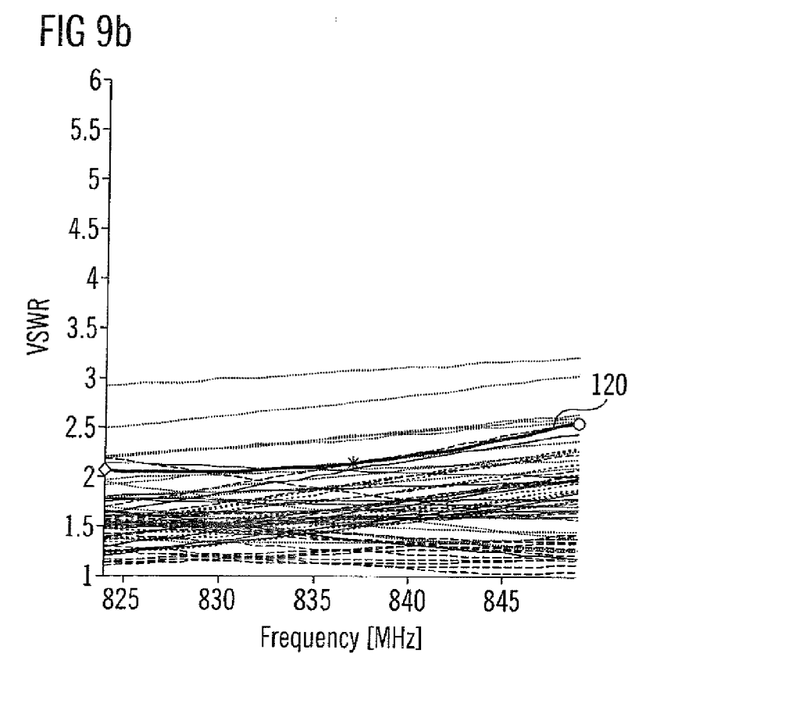
Figure 10A:
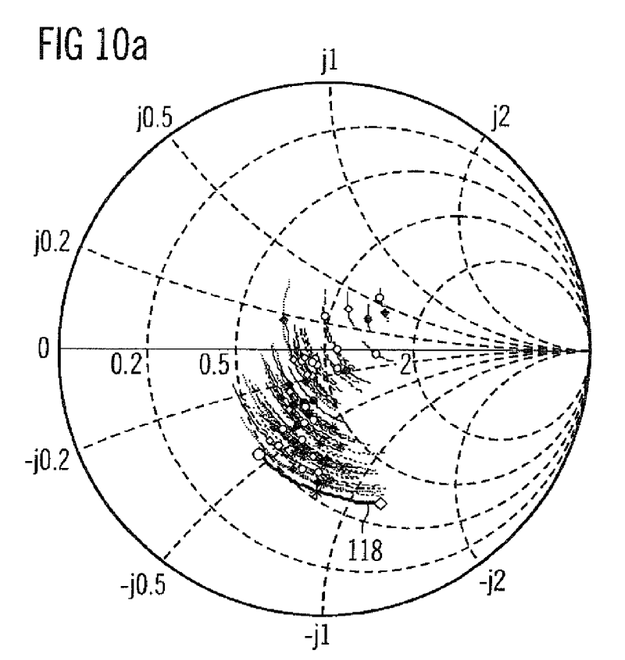
FIG. 10 shows in diagram a) a Smith chart and in diagram b) a graph of Voltage Standing Wave Ratio as a function of frequency in MHz in the GSM 1800 TX band (1710-1785 MHz band), for AIM impedances in free space and with user interaction with adaptive switching.
Figure 10B:
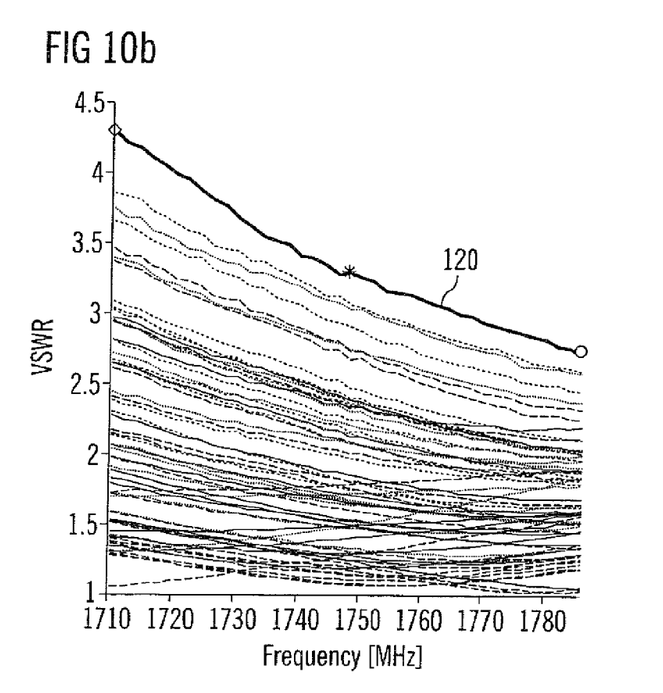
Figure 11A:
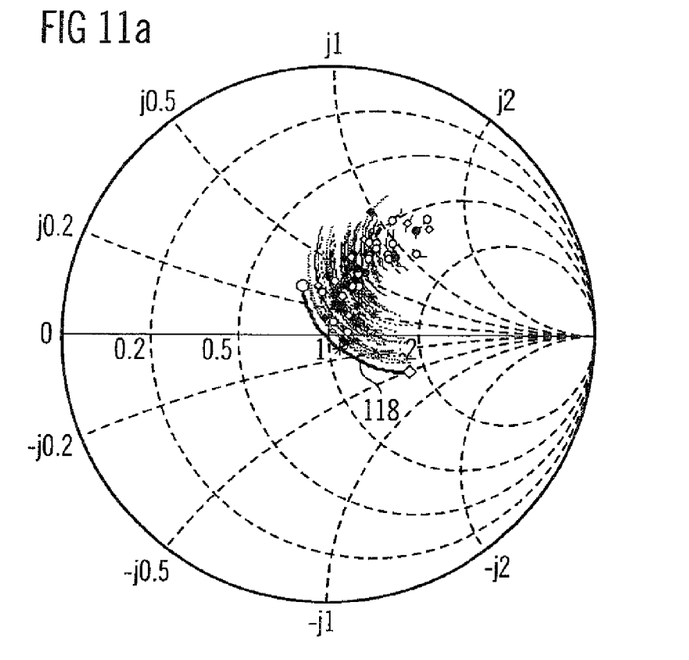
FIG. 11 shows in diagram a) a Smith chart and in diagram b) a graph of Voltage Standing Wave Ratio as a function of frequency in MHz in the GSM 1800 TX band, for AIM impedances in free space and with user interaction.
Figure 11B:
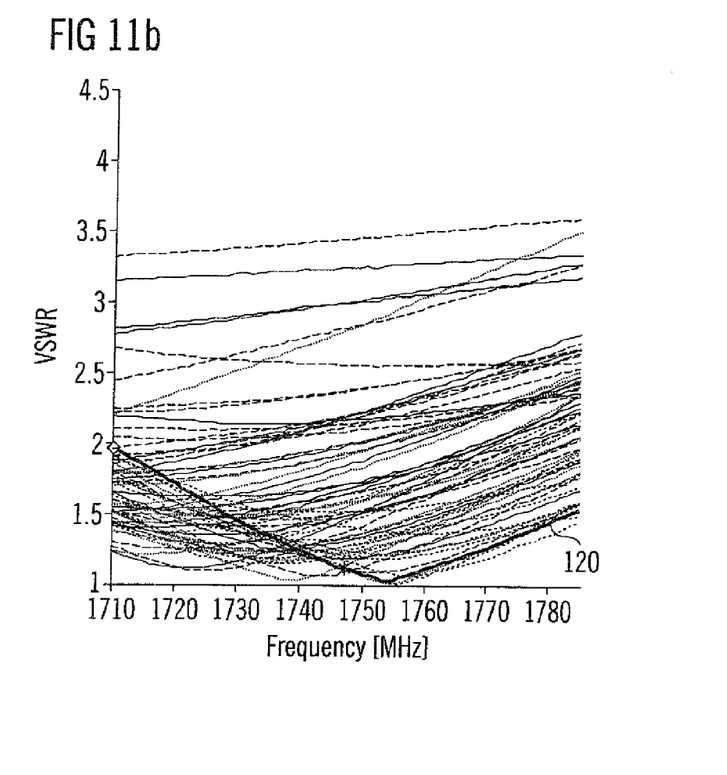
Figure 12A:
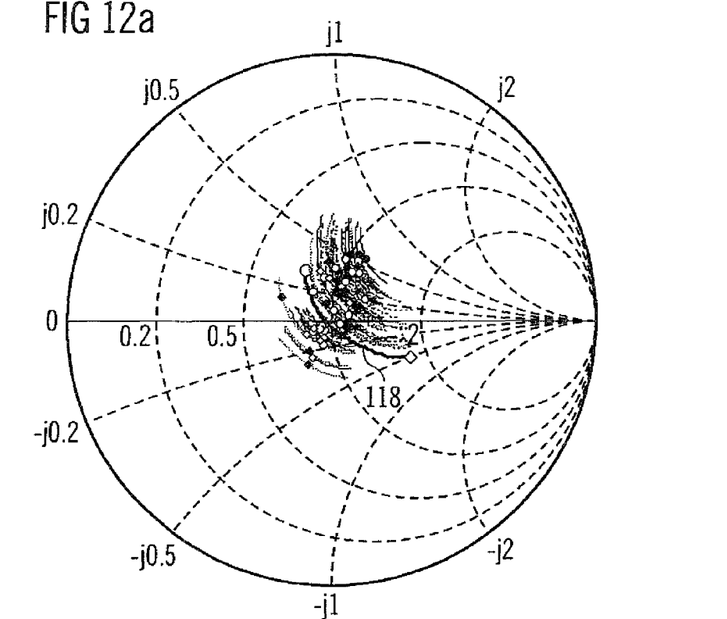
FIG. 12 shows in diagram a) a Smith chart and in diagram b) a graph of Voltage Standing Wave Ratio as a function of frequency in MHz in the GSM 1800 TX band, for AIM impedances in free space and with user interaction with adaptive switching.
Figure 12B:
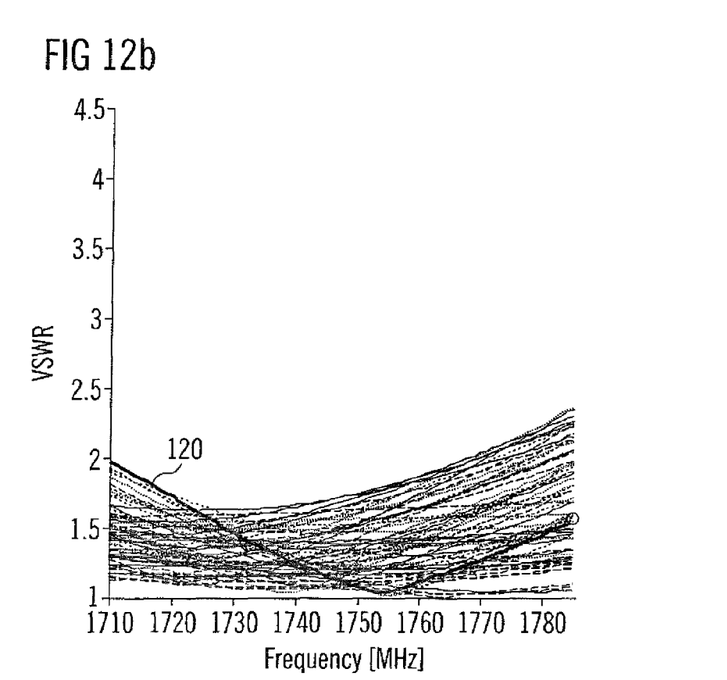

Similarly, FIG. 6 shows contours of constant $K_2$ for $x_S=0.5$.

FIGS. 4 and 5 indicate that a reactance threshold can be chosen by choosing an appropriate inductor, $X_S$. If necessary the AIMS may include several different valued inductors $X_S$ together with selection means for selecting an inductor to suit a particular application.

The following description describes how a reactance threshold detection circuit can be used in an antenna interface module (AIM) having an architecture shown in FIG. 2. In the Smith Charts shown in FIGS. 7(a) to 12(a), the line referenced 118 relates to the free space condition and the other lines relate to different user interactions. In FIGS. 7(b) to 12(b), the bold black line 120 relates to the free space condition and the other lines relate to conditions noted when different volunteers held the portable wireless device.

FIG. 7 shows the low-band antenna impedance, line 120, in free space and in an experiment in which a portable wireless terminal made in accordance with the present invention was held by 63 volunteers for the GSM850 TX band.

FIG. 8 shows the results in which in free space the GSM850 TX band is matched with the series inductor 72 (FIG. 2).

However, user interaction causes an inductive shift, such that for many of the users—51 out of 63—the inductance is counterproductive. Those user interactive results furthest clockwise from the free space condition line 118 indicate that inductance matching is ineffective and in fact many of the results are worse than without any matching. In such circumstances, it is better to switch in the capacitor 68 (FIG. 2) that matches the GSM850 TX band (in free space).

The reactance at which this threshold is reached is used to determine the sensing inductance, $x_S$ and is given by $$x_S = \frac{x_L + x_C}{2} \quad 29)$$

where $x_L$, reactance of matching inductance (positive)

$x_C$, reactance of matching capacitance (negative)

For the case above, the matching inductor 72 is 6.2nH (36.2Ω at 837 MHz) and the capacitor 68 is 8 pF (−23.8Ω at 837 MHz). This gives a sensing inductor 68 value of 0.83nH (4.4 S2 at 837 MHz). If necessary the value of the capacitance 62A may be varied to take into account changes in the series inductance of the inductor 64A.

Simulating with this value, and adjusting the dc blocking capacitor 70 to tune out the inductance, gives the results shown in FIG. 9. Clearly the VSWR is significantly improved—38 of the 63 results where the phone is held use capacitive rather than inductive matching.

FIG. 10 shows the high-band antenna impedance in free space and when held by 63 volunteers for the GSM1800 TX band.

With inductive matching based on the free space impedance, the impedance at the input of the AIM becomes as shown in FIG. 11.

The matching inductor 96 is 3.6nH (39.5Ω at 1747 MHz), while the capacitor 92 used to match the GSM1900 TX band is 11 pF (−8.3Ω at 1747 MHz). This gives a sensing inductor 64B value of 1.42nH (15.6Ω at 1747 MHz).

Simulating with this value, and adjusting the dc blocking capacitor 94 to tune out the inductance, gives the results shown in FIG. 12. As for the low frequency band, the VSWR is significantly improved. 26 of the 63 results where the phone is held use capacitive rather than inductive matching.

In both the low and high frequency bands a slightly larger valued sensing inductor would be more optimum, since the theory above does not take account of circuit losses, parasitics etc.

The reactance measurements can be applied to a receive channel but it is preferred for reactance measurements to be made on the transmit channels because power is supplied by a power amplifier.

APPENDIX A

The Smith Chart

A.1-Impedance circles

A reflection coefficient, p can be directly plotted onto a Smith Chart, since the coordinate system used is Cartesian for the real and imaginary components of ρ. To plot lines of constant resistance and reactance, however, a relationship with the components of ρ is determined.

The normalised impedance is related to reflection coefficient as follows:

$$z = r + jx = \frac{1+\rho}{1-\rho} = \frac{1+\rho_r + j\rho_i}{1-\rho_r - j\rho_i} \quad \text{A.1}$$

where
$\rho_r$ real part of reflection coefficient
$\rho_i$ imaginary part of reflection coefficient
r normalised resistance determined by the ratio of antenna resistance $R_A$ divided by the input impedance, for example 50Ω.
x normalised reactance determined by the ratio of the antenna reactance $R_A$ divided by the input impedance, for example 50Ω.

This can be simplified to give $$z = r + jx = \frac{1 - \rho_r^2 + \rho_i^2 + j2\rho_i^2}{(1-\rho_r)^2 + \rho_i^2} \quad \text{A.2}$$

The real part gives the resistance $$r = \frac{1 - \rho_r^2 + \rho_i^2}{(1-\rho_r)^2 + \rho_i^2} \quad \text{A.3}$$

and the imaginary part gives the reactance $$x = \frac{2\rho_i}{(1-\rho_r)^2 + \rho_i^2} \quad \text{A.4}$$

(A.3) can be simplified to give $$(1+r)\rho_r^2 + r(1-2r) + (1+r)\rho_i^2 = 1 \quad \text{A.5}$$

This can then be further simplified to give $$\left(\rho_r - \frac{r}{1+r}\right)^2 + \rho_i^2 = \left(\frac{1}{1+r}\right)^2 \quad \text{A.6}$$

This is the equation of a circle in the ($\rho_r$, $\rho_i$) plane, centred at (r/(1+r),0) and with a radius equal to 1/(1+r).
(A.4) can be simplified to give $$(\rho_r - 1)^2 + \left(\rho_i - \frac{1}{x}\right)^2 = \left(\frac{1}{x}\right)^2 \quad \text{A.7}$$

This is also the equation of a circle in the ($\rho_r$, $\rho_i$) plane, but centred at (1,1/x) and with a radius equal to 1/x.

A.2-Admittance circles

It can be shown in a similar fashion that lines of constant normalised 15 conductance, g are given by $$\left(\rho_r + \frac{g}{1+g}\right)^2 + \rho_i^2 = \left(\frac{1}{1+g}\right)^2 \quad \text{A.8}$$

and the lines of constant normalised admittance, b are given by $$(\rho_r + 1)^2 + \left(\rho_i + \frac{1}{b}\right)^2 = \left(\frac{1}{b}\right)^2 \quad \text{A.9}$$

In the present specification and claims the word "a" or "an" preceding an element does not exclude the presence of a plurality of such elements. Further, the word "comprising" does not exclude the presence of other elements or steps than those listed.

The use of any reference signs placed between parentheses in the claims shall not be construed as limiting the scope of claims.

From reading the present disclosure, other modifications will be apparent to persons skilled in the art. Such modifications may involve other features which are already known in the design, manufacture and use of portable wireless terminals and component parts therefor and which may be used instead of or in addition to features already described herein.

The invention claimed is:

1. A portable wireless terminal comprising:
    an antenna interface module having a first port for connection to a RF output or input stage and a second port;
    a threshold detector including a reactance threshold detector coupled between the second port and an antenna terminal for connection to an antenna;
    the antenna interface module including first and second switches;
    a first matching circuit including an inductive reactance coupled between the first port and a first pole of the first switch; and
    a second matching circuit including a capacitive reactance coupled between the first port and a first pole of the second switch, second poles of the first and second switches being coupled to the second port,
    the reactance threshold detector providing an output for changing the state of the first switch from a first condition to a second condition and the state of the second switch from a second condition to a first condition, or vice versa, in response to the reactance threshold detector traversing a predetermined threshold value.

2. A portable wireless terminal as claimed in claim 1, wherein the reactance threshold detector comprises a reactance element having a first terminal coupled to the antenna terminal and a second terminal connected to the second port, and a circuit for processing a voltage difference (dv) across the reactance element and a voltage ($v_2$) at its second terminal to determine the phase ($\phi_2$) for reactance measurement.

3. A portable wireless terminal as claimed in claim 1, wherein the reactance threshold detector comprises:
    a reactance element having a first terminal coupled to the antenna terminal and a second terminal coupled to the second port,
    a first amplifier having inputs for receiving voltages ($v_1$,$v_2$) at the first and second terminals and for deriving the difference (dv) between these voltages,
    a second amplifier having an input for receiving the voltage ($v_2$) at the second terminal,
    a circuit for removing amplitude information from the voltages at the outputs of the first and second amplifiers, a multiplier for multiplying together the voltages from which the amplitude information has been removed to produce an output and a filter for filtering the output of the multiplying means to produce a control voltage for operating the first and second switches.

4. A portable wireless terminal as claimed in claim 2, wherein the threshold value is a function of the reactance ($x_S$) of the selected reactance element.

5. A portable wireless terminal as claimed in claim 4, wherein reactance element is an inductor.

6. A portable wireless terminal as claimed in claim 1, wherein in free space the inductive reactance is selected for matching and wherein in response to user interaction causing a reactance change the capacitive reactance is selected for matching.

7. A method of operating a portable wireless terminal comprising an antenna interface module having a first port for connection to a RF output or input stage and a second port, a threshold detector including a reactance threshold detector coupled between the second port and an antenna terminal for connection to an antenna, the antenna interface module including first and second switches, a first matching circuit including an inductive reactance coupled between the first port and a first pole of the first switch, a second matching circuit including a capacitive reactance coupled between the first port and a first pole of the second switch, and second poles of the first and second switches being coupled to the second port, the method comprising:
   monitoring the reactance of the signal at the second port and, in response to the reactance threshold detector traversing a predetermined threshold value,
   changing the state of the first switch from a first condition to a second condition and the state of the second switch from a second condition to a first condition, or vice versa.

8. A method as claimed in claim 7, wherein the reactance threshold detector comprises a reactance element having a first terminal coupled to the antenna terminal and a second terminal connected to the second port, the method further comprising:
   deriving a voltage difference (dv) across the reactance element and a voltage ($v_2$) at the second terminal of the reactance element; and
   processing the derived voltage difference and the voltage to determine the phase ($\phi_a$) for reactance measurement.

9. A method as claimed in claim 7, wherein the reactance threshold detector comprises a reactance element having a first terminal coupled to the antenna terminal and a second terminal coupled to the second port, the method further comprising:
   deriving a voltage difference (dv) across the reactance element and a voltage ($v_2$) at the second terminal of the reactance element;
   amplifying and limiting the voltages derived;
   multiplying together the amplified and limited voltage voltages; and
   deriving a DC control voltage by filtering the multiplied signals.

10. A method as claimed in claim 7, where in free space the inductive reactance is selected for matching and wherein in response to user interaction causing a reactance shift the capacitive reactance is selected for matching.

\* \* \* \* \*